United States Patent [19]

Saruwatari et al.

[11] Patent Number: 5,260,407

[45] Date of Patent: * Nov. 9, 1993

[54] POLYIMIDE FILM AND PREPARATION PROCESS OF THE FILM

[75] Inventors: Masumi Saruwatari; Yasuhiko Ohta; Yasuhiro Fujii, all of Nagoya; Yasuko Honji, Ichinomiya; Shoichi Tsuji, Tanashi; Shinobu Moriya, Nagoya, all of Japan

[73] Assignee: Mitsui Toatsu Chemicals, Incorporated, Tokyo, Japan

[ * ] Notice: The portion of the term of this patent subsequent to Aug. 17, 2010 has been disclaimed.

[21] Appl. No.: 550,015

[22] Filed: Jul. 9, 1990

[30] Foreign Application Priority Data

| Jul. 17, 1989 [JP] | Japan | 1-182462 |
| Jul. 17, 1989 [JP] | Japan | 1-182463 |
| Jul. 17, 1989 [JP] | Japan | 1-182464 |
| Sep. 28, 1989 [JP] | Japan | 1-250766 |
| Oct. 20, 1989 [JP] | Japan | 1-271503 |

[51] Int. Cl.$^5$ .................... C08G 73/10; C08G 69/26
[52] U.S. Cl. .................... 528/183; 528/125; 528/128; 528/170; 528/171; 528/172; 528/173; 528/185; 528/188; 528/220; 528/229; 528/350; 528/353; 428/473.5; 264/288.4; 264/290.2
[58] Field of Search .............. 528/125, 128, 188, 220, 528/229, 350, 353, 183, 170, 171, 172, 173, 185; 264/288.4, 290.2; 428/473.5

[56] References Cited

U.S. PATENT DOCUMENTS

| 3,619,461 | 11/1971 | Gay | 528/125 |
| 4,499,042 | 2/1985 | Ishizuka et al. | 528/353 |
| 4,795,798 | 1/1989 | Tamai | 528/185 |
| 4,847,349 | 7/1989 | Ohta | 528/125 |
| 4,871,500 | 10/1989 | Harms et al. | 428/473.5 |
| 4,908,409 | 3/1990 | Oikawa | 528/172 |
| 4,915,894 | 4/1990 | Mitsui et al. | 428/473.5 |
| 4,966,680 | 10/1990 | Harvey et al. | 428/473.5 |
| 5,087,689 | 2/1992 | Ohta | 528/185 |

FOREIGN PATENT DOCUMENTS

| 251741 | 1/1988 | European Pat. Off. . |
| 0294129 | 12/1988 | European Pat. Off. . |
| 62-201524 | 9/1987 | Japan . |

OTHER PUBLICATIONS

Database WIPL, No. 87-304105, Derwent Publications Ltd., JP-A-62 214927, whole abstract.
Database WIPL, No. 88-327647, Derwent Publications Ltd., JP-A-63 242625, whole abstract.
CA 113(24): 213463s, "Polyimide Melt Extrusion through tapered Die in Manufacture of film", Tsutsumi, et al, 1990.

Primary Examiner—John Kight, III
Assistant Examiner—P. Hampton-Hightower
Attorney, Agent, or Firm—Burns, Doane, Swecker & Mathis

[57] ABSTRACT

A polyimide film essentially consisting of polyimide having recurring units of the formula (I):

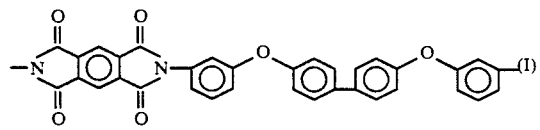

which has a density of 1.335 to 1.390 g/cm$^3$ at 23° C. and/or a refractive index of 1.605 to 1.680 at 23° C. in the direction of thickness and is transparent; and a preparation process of the polyimide film by extruding the polyimide having recurring units of the above formula (I) through a common melt-extrusion process, casting on a chill-roller to obtain an unstretched film, uniaxially or biaxially stretching the unstretched film to cause molecular orientation, and successively setting the stretched film through heat-treatment.

12 Claims, No Drawings

POLYIMIDE FILM AND PREPARATION PROCESS OF THE FILM

BACKGROUND OF THE INVENTION

1. Field of the Invention

The present invention relates to a polyimide film having stability in mechanical properties and dimension over a broad range of temperatures and to a preparation process for the film.

More particularly, the invention relates to a polyimide film essentially consisting of a thermoplastic polyimide having excellent heat resistance and mechanical properties and to a process for the preparation of said polyimide film by melt-extruding the thermoplastic polyimide into the form of a sheet, followed by uniaxially or biaxially stretching the sheet under specific conditions to cause molecular orientation and then subjecting the resultant film to heat-treatment.

2. Description of the Prior Art

Industrial materials for electric and electronic industries, automotive industry and atomic industry have recently been intended to improve reliability over a long period, miniaturize the products and reduce the weight of products. Consequently, plastic films for use in these products have been required to be excellent in heat-resistance, mechanical properties and dimensional stability.

Thermoplastic polymers having heat resistance, for example, polyphenylene sulfide, polyaryl ketone, polyaryl sulfone, polyallylate, polyester and polycarbonate have conventionally been known and investigated to prepare plastic films in order to meet with the above requirement for heat resistance. However, these films have insufficient heat-resistance and their properties are also unsatisfactory for industrial materials. Hence, the field of application for these films has been restricted.

At present, film materials having the highest heat-resistance designed to meet the above requirement are various polyimide films such as Upilex TM (a product of Ube Industries Ltd.) and Kapton TM (a product of E.I. Du Pont De Nemours & Co.). Since hot molding of these polyimides is difficult, films are prepared by a so-called solution casting method where a polyamic acid precursor solution is cast, solvent is removed, and the residual film is heat-treated. The method is, however, poor in productivity and high in cost.

Polyimide having recurring structural units represented by the formula (I):

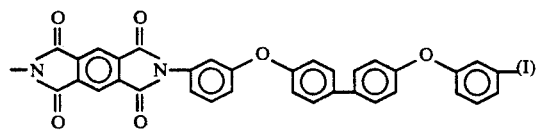

has been disclosed as a hot-moldable polyimide in, for example, Japanese Patent Laid-Open Publication SHO 62-205124(1987). However, the film obtained by the disclosed process has lower mechanical strength and becomes soft above its glass transition temperature of about 240° C., and additionally changes from transparent to opaque and becomes brittle at temperatures exceeding 280° C. Thus heat-resistance of the film is unsatisfactory.

SUMMARY OF THE INVENTION

One object of the present invention is to provide a polyimide film which is prepared from polyimide raw material having recurring structural units represented by the formula above and is excellent in heat resistance, mechanical properties and dimensional stability.

Another object of the present invention is to provide a process for preparing the polyimide film.

The present inventors have carried out an intensive investigation in order to achieve the above objects and found that a polyimide film prepared from the polyimide raw material having recurring structural units represented by the formula (I):

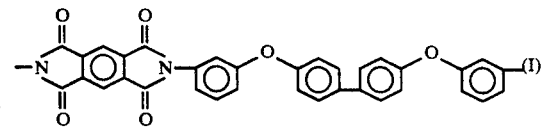

is excellent in heat resistance and mechanical properties and have developed a process for preparing the polyimide film having these characteristics.

That is, one aspect of the invention is a polyimide film essentially consisting of polyimide having recurring structural units represented by the above formula (I) comprising a density of from 1.335 to 1.390 g/cm$^3$ at 23° C. and/or a refractive index of from 1.605 to 1.680 in the thickness direction and being transparent.

Another aspect of the invention is a process for the preparation of the polyimide film comprising the steps of extruding the polyimide having recurring units of the formula (I) through a common melt-extrusion process, casting on a chill-roller to give an unstretched film, followed by uniaxially or biaxially stretching the film to cause molecular orientation and then setting the stretched film through heat-treatment. Further in detail, the unstretched film prepared by the melt-extrusion process from the polyimide having the recurring units of the formula (I) is stretched from 1.5 to 10 times in the temperature range of from 230° to 320° C. in one direction or in both directions which are at right angles to each other and is successively heat-set under tension in the temperature range of from 250° C. to less than melting point of the film.

That is, the method for stretching the unstretched film has the following aspects.

(1) The unstretched film is stretched from 1.5 to 5.0 times in one direction in the temperature range of from 230° to 300° C., and is successively heat-set under tension in the temperature range of from 250° C. to less than melting point of the film.

(2) The unstretched film is stretched from 1.5 to 3.0 times in one direction in the temperature range of from 240° to 300° C. and from 1.5 to 3.0 times in the direction which is at right angles to said stretching direction in the temperature range of from 250° to 320° C. and is successively heat-set under tension in the temperature range of from 250° C. to less than melting point of the film.

(3) The unstretched film is stretched at the area magnification of 2 to 10 in both directions which are at right angles to each other in the temperature range of 250° to 300° C., and is successively heat-set under tension in the temperature range of 250° C. to less than melting point of the film.

(4) The film can also be stretched in the temperature range of from 150° C. to less than glass transition temperature by maintaining the moisture content of the film from 0.1 to less than 3% during the stretching step.

The preparation process of the polyimide film in the invention is a very effective process for the production of practical polyimide film having superior heat-resistance and mechanical properties to those of conventional polyimide films.

By adjusting the moisture content of the film during stretching, the preparation process of the polyimide film in the invention can conduct film stretching at a temperature lower than the glass transition temperature, which method has conventionally been considered very difficult. Additionally, hot-molding can be carried out and hence the process is very effective for the production of practical films having superior heat-resistance and mechanical properties to these of conventional polyimide film.

The polyimide film of the present invention is excellent in heat and chemical resistance and additionally in mechanical strength and dimensional stability. Hence the polyimide film can be suitably used for the fields such as wire covering, liner insulation material for motors and transformers, flexible substrate for printed circuits, capacitors and other electric and electronic parts, and precision parts such as base films for recording medium. Consequently the polyimide film of the present invention has great contribution to industry.

DESCRIPTION OF THE PREFERRED EMBODIMENTS

The polyimide of the present invention has recurring structural units represented by the above formula (I).

The polyimide can be prepared by reacting pyromellitic dianhydride (hereinafter referred to as acid anhydride) with 4,4'-bis(3-aminophenoxy)biphenyl(-hereinafter referred to as diamine) and imidizing the resultant polyamic acid represented by the formula (II):

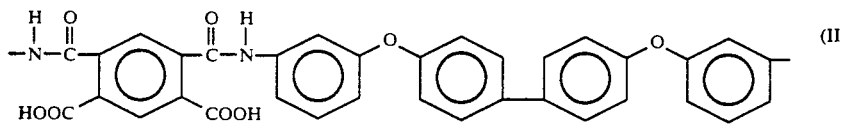

The polyimide of the formula (I) is preferably comprised of 95% by mole or more of the acid anhydride and the diamine, respectively. A polyimide containing 5% by mole and more of other acid dianhydrides or diamines has decreased crystallinity and increased amorphicity. Consequently, even after molecular orientation by stretching, heat-treatment gives insufficient set and the dimensional stability of the film decreases unfavorably.

The polyimide film of the present invention can be prepared by using the above polyimide as the raw material, preparing the amorphous film generally by melt-extrusion process, casting on a chill-roller to give an unstretched film, stretching the film uniaxially or biaxially and conducting heat-treatment to crystallize the film.

The polyimide film of the present invention is obtained by conducting molecular orientation through stretching in the interior of the film. The degree of molecular orientation can be judged by each refractive index $n_x$, $n_y$ and $n_z$ in the two rectangular directions (x and y directions) and in the thickness direction (z direction), respectively, and particularly by the refractive index in the thickness direction of the film interior. For example, the orientation in the direction in the film interior increases $n_x$ and decreases $n_y$, $n_z$, and then increases the birefringence($n_x - n_y$) in the film interior. On the other hand, the orientation in both the x and y directions increases both $n_x$ and $n_y$, and $n_z$ alone. Thus, the refractive index in the thickness direction indicates degree of molecular orientation in the film interior. In the present invention, the refractive index $n_z$ in the thickness direction is preferably from 1.605 to 1.680. $n_z$ is 1.690 in the non-oriented state, that is, unstretched film. $n_z$ exceeding 1.680 leads to unfavorable problems such as loss of transparency and tendency of embrittlement at high temperatures. On the other hand, when $n_z$ is less than 1.605, the film causes remarkable fibrillation and becomes unpractical because cracks and tears are liable to occur. The particularly preferred refractive index in the thickness direction is in the range of from 1.615 to 1.675.

The polyimide of the present invention has a density in the range of preferably from 1.335 to 1.390 $g/cm^3$. The density is measured by a density gradient tube method using a mixed organic solvent system such as carbon tetrachloride-toluene or an aqueous inorganic salt solution such as an aqueous sodium sulfate solution. The density less than 1.335 $g/cm^3$ leads to unfavorably large dimensional change at high temperatures, above 250° C. in particular. On the other hand, a density of 1.390 $g/cm^3$ or more causes remarkable crystallization and unfavorably results in cracks, tears and inferior mechanical properties. A particularly preferred range of density is from 1.340 to 1.370 $g/cm^3$.

The polyimide of the present invention is particularly preferred when both the refractive index in the thickness direction and the density are in the above range.

The preparation process of the invention will hereinafter be illustrated in detail.

The polyimide used for the raw material of the invention can be obtained by conducting a polymerization reaction of the above acid anhydride with diamine and successibly imidizing the resulting intermediate. The polyimide particularly preferred for use has a melt viscosity in the range of usually from 100 to 600,000 poise at 400° C. under a shear rate of 200 $sec^{-1}$. A melt viscosity less than 100 poise is liable to cause gelation in the melt-extrusion step, give adverse effects on the surface appearance of the film and also decreases mechanical strength of the film. On the other hand, a melt viscosity exceeding 600,000 poise makes melt-extrusion difficult and causes problems such as embrittlement and difficult stretching of the film. Consequently, the polyimide having a melt viscosity in the above range is frequently used.

By using the polyimide mentioned above, an unstretched film is prepared by melt-extrusion, calendering and other processes.

The preparation process is most preferably carried out by melting the polyimide in an extruder at a temperature of 300° to 450° C., delivering the melt through a slit nozzle, and cooling on a casting roller having a surface temperature of 100° to 250° C. to obtain an unstretched film (amorphous film).

The primary characteristic of the present invention is to stretch and heat-set the above obtained unstretched film under specific conditions.

The unstretched film used for the stretching and heat setting desirably has a density of 1.350 g/cm³ or less. A density exceeding 1.350 kg/cm³ causes embrittlement of the film and film breakage unfavorably occurs in the successive step for stretching.

The stretching and heat setting of the unstretched film is conducted by stretching the film 1.5 to 10 times in one direction or in both directions which are at right angles to each other in the temperature range of 230° to 320° C., and successively by heat setting the film under tension in the temperature range of from 250° C. to less than melting point of the films. The stretching and heat setting process can be classified into the following embodiments according to the specific conditions of stretching treatment.

(1) A method for stretching the film 1.5 to 5.0 times in one direction in the temperature range of 230° to 300° C. and successively conducting heat setting under tension in the temperature range of from 250° C. to less than melting point of the film (hereinafter referred to as uniaxial stretching method).

(2) A method for stretching the film 1.5 to 3.0 times in one direction in the temperature range of 240° to 300° C., successively stretching 1.5 to 3.0 times in the direction which is at right angles to said direction in the temperature range of 250° to 320° C., and then conducting heat setting under tension in the temperature range of from 250° C. to less than melting point of the film (hereinafter referred to as successive-biaxial stretching method).

(3) A method for stretching the film at the area magnification of 2 to 10 simultaneously in both directions which are at right angles to each other in the temperature range of 250° to 300° C., and successively carrying out heat setting under tension in the temperature range of from 250° C. to less than melting point of the film (hereinafter referred to as simultaneous-biaxial stretching method).

(4) A method for stretching the film in the temperature range of 150° C. to less than the glass transition temperature of the film by maintaining the moisture content of the film from 0.1 to less than 3% during the stretching step.

Each embodiment will hereinafter be illustrated further in detail.

(1) Uniaxial stretching method

The embodiment is a method for preparing a uniaxially stretched film by stretching the above unstretched film in one direction in a specific temperature range, and successively heat setting the stretched film.

Practical conditions of the uniaxial stretching method are stretching of 1.5 to 5.0 times to one direction in the temperature range of 230° to 300° C., preferably 240° to 290° C. The unstretched film is uniaxially oriented under these conditions.

A stretching temperature lower than 230° C. leads to difficulty in stretching. On the other hand, a temperature exceeding 300° C. is also unfavorable because the film loses transparency, embrittles and cannot be stretched.

A stretching magnification less than 1.5 unfavorably leads to development of creases in the successive heat-treatment step or to embrittlement of the film. On the other hand, a stretching magnification exceeding 5.0 results in high orientation in the course of stretching step and causes unfavorable problems such as film breakage.

The film can be stretched by using conventional techniques such as a stretching method using a pair or more of rollers, a method using a tenter, and a stretching method by rolling out.

The rate of stretching is preferably in the range of 1 to 100,000 %/min. Preheating of the film before stretching to the extent of preventing crystallization is preferable for carrying out smooth stretching.

The uniaxially stretched film thus obtained is successively heat-set for 1 to 5,000 seconds under tension or shrinkage restriction in the temperature range of from 250° C. to less than melting point of the film preferably from 270° to 370° C.

(2) Successive-biaxial stretching method

The embodiment in the method for preparing a biaxially stretched film by stretching the above unstretched film in one direction in a specific temperature range, successively stretching the resultant film in the direction which is at right angles to said direction in a specific temperature range, and then heat-setting the stretched film.

Practical conditions of the successive-biaxial stretching method are a first step stretching of 1.5 to 3.0 times in one direction in the temperature range of 240° to 300° C., preferably 250° to 290° C., and a second step stretching of 1.5 to 3.0 times in the direction which is at right angles to the direction of the first step stretching in the temperature range of 250° to 320° C., preferably 260° to 310° C. The unstretched film is biaxially oriented under these conditions.

The film can be stretched by using conventional techniques such as a stretching method using a pair or more of rollers, a method using a tenter, and a stretching method by rolling out.

A first step stretching temperature lower than 240° C. leads is to difficulty in stretching. On the other hand, a temperature exceeding 300° C. is also unfavorable because the film loses transparency, embrittles and cannot be stretched.

A stretching magnification less than 1.5 unfavorably leads to development of creases in the successive heat-treatment step or to embrittlement of the film. On the other hand, a stretching magnification exceeding 3.0 results in high orientation in the course of the stretching step and causes unfavorable problems such as film breakage in the second stretching step.

A second step stretching temperature lower than 250° C. leads to difficulty in stretching and frequent occurrence of film breakage.

On the other hand, a temperature exceeding 320° C. results in unfavorable development of troubles such as embrittlement and breakage of the film. Preferred stretching magnification is in the range of 1.5 to 3.0 in view of orientation effect and film breakage.

The rate of stretching is preferably in the range of 1 to 100,000 %/min. Preheating of the film before stretching to the extent of preventing crystallization is preferable for carrying out smooth stretching.

The biaxially stretched film thus obtained is successively heat-set for 1 to 5,000 seconds under tension or shrinkage restriction in the temperature range of from 250° C. to less than melting point of the film, preferably from 270° to 370° C.

(3) Simultaneous-biaxial stretching method

This embodiment is a method for preparing a biaxially stretched polyimide film by stretching the above unstretched film at the area magnification of 2 to 10 simultaneously in both directions which are at right angles to each other in a specific temperature range, and successively heat-setting the stretched film in the temperature range of 250° C. to less than melting point of the film.

Practical conditions of the simultaneous-biaxial stretching are to stretch the unstretched film in the area magnification range of 2 to 10 and in the temperature range of 250° to 300° C., preferably 260° to 290° C. The unstretched film is biaxially oriented under these conditions.

A stretching temperature lower than 250° C. causes high stretching stress and makes stretching impossible. On the other hand, a stretching temperature exceeding 300° C. is unfavorable because of the same phenomenon can occur in the first step of the above successive-biaxial stretching method.

A stretching magnification less than 2 by area ratio is unfavorable because creases or embrittlement of the film develops in the successive heat-treatment step. Stretching cannot be carried out under stretching magnification exceeding 10.

The rate of stretching is preferably in the range of 1 to 100,000 %/min. Preheating of the film before stretching to the extent of preventing crystallization is preferred for carrying out stretching smoothly.

The biaxially stretched film thus obtained must be successively heat-set for 1 to 5,000 seconds under tension or shrinkage restriction in the temperature range of 250° C. to less than melting point of the film, preferably from 270° to 370° C.

(4) Stretching method under specific moisture content of the unstretched film This embodiment is a method for preparing a polyimide film having excellent properties, in the process of forming, stretching and heat-setting the polyimide film, by adjusting the moisture content of the film in a specific range and stretching the film at a temperature lower than the glass transition temperature, which method has conventionally been considered very difficult.

That is, an unstretched film having a moisture content of at least 0.1% is stretched in the temperature range of 150° C. to less than glass transition temperature of the film.

The film for use in the process of the present invention has a moisture content of preferably 0.1% or more. A moisture content less than 0.1% increases stiffness of the film and makes the stretching operation difficult due to an increase in tension. Other unfavorable problems also occur, for example, loss of clarity and remarkable decrease in mechanical strength due to the development of microvoids. No particular limitation is imposed upon the maximum moisture content. The maximum moisture content is usually less than 3%, preferably from 0.2 to 2% in particular.

The polyimide used in the present invention absorbs 0.5% or more of moisture in the usual atmosphere and can absorb about 3% of water when immersed in warm water.

In the process of the present invention, the stretching temperature is preferably in the range of from 150° C. to the glass transition temperature and the stretching magnification is preferably from 1.2 to 2.5. Stretching at a temperature exceeding the glass transition temperature leads to reduction of moisture content and development of extreme orientation in the stretching step, thereby rendering the stretching operation difficult.

In the stretching process of the present invention, the above film can be uniaxially or biaxially stretched with a roller stretching system using at least a pair of rollers or with a tenter system.

The rate of stretching is preferably in the range of 1 to 100,000 %/min.

In order to increase density and to improve dimensional change characteristic and mechanical properties, the stretched film thus obtained is heat-set for 1 to 5,000 seconds under tension or shrinkage restriction in the temperature range of from 250° C. to less than melting point of the film, preferably from 270° to 370° C. The heat treatment enhances dimensional stability and other properties of the film. The film is substantially transparent unless processed so as to have a rough surface in particular.

The polyimide film thus obtained is useful for electric insulation films for high temperature, substrates for recording medium and dielectric films.

The thickness of the film of the invention varies depending upon application. No particular restriction is put upon the thickness. The film thickness is usually from 0.1 $\mu$m to less than 5 mm.

The present invention will hereinafter be illustrated further in detail by way of examples.

The properties of polyimide illustrated in the examples were measured by the following methods.

(1) Refractive index (thickness direction)

Abbe's refractometer 4-T TM (a product of ATAGO Co., Ltd.) was used. Measurement was conducted by deflection method at 23° C. by using sulfur/methylene iodide intermediate liquid.

(2) Density

Density gradient tube was used. Measurement was conducted at 23° C. in toluene-carbon tetrachloride.

(3) Glass transition temperature

Du Pont 1090 TM thermal analyzer (a product of E.I. Du Pont De Nemours & Co.) was used. Measurement was conducted according to DSC method at a temperature rise rate of 4° C./min.

(4) Tensile test

Tensile test was carried out respectively in the x and y directions of the sample in accordance with ASTM D-882.

Tensile strength at break and initial elastic modulus were measured.

(5) Heat shrinkage

Shrinkage after heating at 280° C. for 2 hours was measured in accordance with JIS C-2318.

(6) Solder heat resistance

Appearance of the specimen was observed after floating on a solder bath at 260° C. for 30 seconds.
○ No deformation was found.
X Deformation occurred.

PREPARATION EXAMPLE OF AN UNSTRETCHED FILM

To a reaction vessel equipped with a stirrer, reflux condenser, and a nitrogen inlet tube, 368.4 g (1 mole) of 4,4'-bis(3-aminophenoxy)biphenyl and 2,500 g of N,N-dimethylacetamide were charged. In the nitrogen atmosphere, 213.7 g (0.98 mole) of pyromellitic dianhydride was added by portions with caution to prevent temperature rise of the solution and 5.92 g (0.04 mole) of phthalic anhydride was further added. The mixture obtained was stirred for about 20 hours at room temperature and successively 30.3 g (0.3 mole) of triethylamine and 30.6 g (0.3 mole) of acetic anhydride were added over about 30 minutes. After stirring the reaction mixture for 30 minutes, 2,500 g of methanol was added and precipitated polyimide was filtered at 30° C. Filtered polyimide was washed with methanol and acetone, and dried at 300° C. for 8 hours in the nitrogen atmosphere. Polyimide powder thus obtained was 528 g. Yield was 96%.

Melt viscosity of the polyimide powder was measured with a KOKA model flow tester CFT-500 TM (a product of SHIMADZU Seisakusho Co. Ltd.). The apparent melt viscosity was 6,400 poise at 400° C. under apparent shear rate of 200/seconds.

Polyimide powder thus obtained was dried at 180° C. for 24 hours, charged in a vented extruder of 25 mm in diameter, melted at 410° C., extruded through a nozzle of 2 mm in diameter, and allowed to cool to obtain a strand of about 1.8 mm in diameter. The strand was cut into a length of about 3 mm to obtain pellets. The pellets had a melt viscosity of 6,500 poise.

The pellets were dried at 180° C. for 24 hours, fed to a 25 mm extruder, heat-melted at 410° C., delivered from a slit die having a width of 150 mm and an opening of 1.0 mm and taken up on a roller at 220° C. to obtain a film of about 0.5 mm in thickness. The film thus obtained had a density of 1.327 g/cm$^3$. The X-ray diffraction diagram of the film had no peak assigned to crystallinity and indicated that the film was amorphous.

EXAMPLES 1 TO 4

An unstretched film of 10 cm square in size was fitted on a stretcher X4HDHT TM (a product of TOYO Seiki Manufacturing Co., Ltd.). The film was stretched, under conditions illustrated in Table 1, only to the X direction which was defined as the film flow direction in the melt-extrusion process. The stretched film was held intact, heated to 300° C. and heat-treated for 30 minutes.

In any example, the stretching and heat-treatment step were carried out in good conditions and breakage or non-uniform stretching was not observed during operation. The properties of the film obtained were excellent in heat resistance, dimensional stability and mechanical strength as illustrated in Table 1.

COMPARATIVE EXAMPLES 1

The unstretched film had a density of 1.327 g/cm$^3$, and a refractive index of 1.690 in the thickness direction. Mechanical properties of the unstretched film was unsatisfactory. Dimensional stability and solder heat resistance were also poor. Results are illustrated in Table 1.

COMPARATIVE EXAMPLES 2 TO 4

The unstretched film was stretched under conditions illustrated in Table 1. When stretching was carried out at 220° C., stretching magnification became non-uniform, whitening occurred in part, and mechanical strength was poor. When stretching was conducted at 310° C. as in Comparative Example 3, crystallization occurred in the preheating step and caused breakage in the stretching step.

When the stretching magnification was 5.5 as in Comparative Example 4, physical properties of the stretched film was good. The film, however, had extremely high tearability and was liable to cause breakage in the stretching step. Results are illustrated in Table 1.

EXAMPLES 5 TO 12 AND COMPARATIVE EXAMPLES 5 TO 12

The unstretched film was biaxially stretched and heat-treated under conditions illustrated in Table 1. Under conditions of the examples, any film could be uniformly stretched without breakage, and any stretched film obtained was good in heat resistance, mechanical properties and dimensional stability.

However, under conditions of the comparative examples, stretching state was irregular or dimensional stability and physical properties of stretched film were poor. Results are illustrated in Table 1.

EXAMPLES 13 TO 17 AND COMPARATIVE EXAMPLES 13 TO 15

The unstretched film was humidified under conditions illustrated in Table 2. The moisture content of the humidified film was measured with a HIRANUMA-Model Moisture Tester. The humidified film was previously held in the preheating conditions illustrated in Table 2, thereafter taken quickly and the moisture content was immediately measured. The value obtained was considered as the moisture content during the stretching step.

The humidified film was stretched under preheating and stretching conditions illustrated in Table 2. The stretched sample was held as such and heated to 300° C., and heat treatment was carried out at 300° C. for 30 minutes.

Under conditions of the examples, any film could be stretched uniformly and any stretched film obtained was satisfactory in physical properties. However, under the moisture content or the stretching conditions of the comparative examples, the stretched film caused loss of transparency, breakage and insufficient mechanical strength. Results are illustrated in Table 2.

TABLE 1

| Example | Stretching method | Preheating Temperature (°C.) | Preheating Time (min) | x-Stretching Temperature (°C.) | x-Stretching Magnification | x-Stretching Rate (%/min) | y-Stretching Temperature (%) | y-Stretching Magnification | y-Stretching Rate (%/min) | Heat treatment Temperature (°C.) |
|---|---|---|---|---|---|---|---|---|---|---|
| Example | | | | | | | | | | |
| 1 | Uniaxial | 240 | 5 | 240 | 1.5 | 50 | — | — | — | 300 |
| 2 | | 270 | 8 | 270 | 3.5 | 500 | — | — | — | 300 |
| 3 | | 290 | 10 | 290 | 2.5 | 500 | — | — | — | 300 |
| 4 | | 280 | 10 | 280 | 4.0 | 500 | — | — | — | 330 |
| 5 | Successive- | 280 | 7 | 280 | 2.0 | 500 | 280 | 2.0 | 500 | 300 |
| 6 | biaxial | 280 | 9 | 280 | 3.0 | 500 | 280 | 3.0 | 500 | 300 |
| 7 | | 290 | 7 | 290 | 1.5 | 500 | 290 | 1.5 | 500 | 300 |
| 8 | | 260 | 10 | 260 | 2.0 | 50 | 260 | 2.0 | 50 | 300 |
| 9 | | 250 | 10 | 250 | 1.5 | 20 | 250 | 1.5 | 20 | 300 |

TABLE 1-continued

| | | | | | | | | | | |
|---|---|---|---|---|---|---|---|---|---|---|
| 10 | Simultan. | 280 | 10 | 280 | 3.0 | 500 | 280 | 3.0 | 500 | 300 |
| 11 | biaxial | 270 | 15 | 270 | 2.0 | 500 | 270 | 2.0 | 500 | 300 |
| 12 | | 260 | 20 | 260 | 1.5 | 50 | 260 | 1.5 | 50 | 300 |
| Compara. Example | | | | | | | | | | |
| 1 | unstretched | — | — | — | — | — | — | — | — | — |
| 2 | Uniaxial | 220 | 7 | 220 | 2.0 | 50 | — | — | — | 300 |
| 3 | | 310 | 2 | 310 | 2.0 | 1000 | — | — | — | — |
| 4 | | 280 | 7 | 280 | 5.5 | 500 | — | — | — | 300 |
| 5 | Successive- | 280 | 7 | 280 | 2.0 | 500 | 240 | 2.0 | 50 | — |
| 6 | biaxial | 280 | 7 | 280 | 2.0 | 500 | 330 | 2.0 | 50 | — |
| 7 | | 290 | 7 | 290 | 3.5 | 500 | 290 | 3.5 | 50 | — |
| 8 | | 230 | 7 | 230 | 1.5 | 50 | 280 | 1.5 | 500 | 300 |
| 9 | Simultan. | 240 | 10 | 240 | 1.5 | 500 | 240 | 1.5 | 500 | 300 |
| 10 | biaxial | 310 | 2 | 310 | 2.0 | 500 | 310 | 2.0 | 500 | — |
| 11 | | 290 | 10 | 290 | 3.5 | 500 | 290 | 3.5 | 500 | 300 |
| 12 | | 280 | 10 | 280 | 1.1 | 500 | 280 | 1.1 | 500 | 300 |

| Example | Heat treatment Time (min) | Refractive index [—] | Density (g/cm$^3$) | Strength (kg/mm$^2$) | Elastic modulus (kg/mm$^2$) | Heat shrinkage (%) | Solder heat resistance | Remarks |
|---|---|---|---|---|---|---|---|---|
| 1 | 30 | 1.6676 | 1.352 | 15.2/9.8 | 630/410 | 2.1 | ○ | — |
| 2 | 30 | 1.6180 | 1.368 | 29.5/10.8 | 850/350 | 0.5 | ○ | — |
| 3 | 30 | 1.6521 | 1.358 | 25.1/11.5 | 700/380 | 0.8 | ○ | — |
| 4 | 30 | 1.6150 | 1.375 | 35.5/10.1 | 900/400 | 1.5 | ○ | — |
| 5 | 30 | 1.6476 | 1.370 | 17.9/20.5 | 610/750 | 1.1 | ○ | — |
| 6 | 30 | 1.6156 | 1.377 | 21.6/26.5 | 770/880 | 1.7 | ○ | — |
| 7 | 30 | 1.6760 | 1.345 | 14.5/13.4 | 540/580 | 0.8 | ○ | — |
| 8 | 30 | 1.6215 | 1.358 | 20.5/21.5 | 650/660 | 0.5 | ○ | — |
| 9 | 30 | 1.6562 | 1.351 | 15.5/16.6 | 600/580 | 1.0 | ○ | — |
| 10 | 30 | 1.6173 | 1.373 | 25.4/10.8 | 870/900 | 0.3 | ○ | — |
| 11 | 30 | 1.6275 | 1.372 | 24.1/21.5 | 750/780 | 0.5 | ○ | — |
| 12 | 30 | 1.6415 | 1.361 | 20.3/18.5 | 620/600 | 0.8 | ○ | — |
| Compara. Example | | | | | | | | |
| 1 | — | 1.6901 | 1.327 | 9.8/10.5 | 350 400 | 15.0 | x | — |
| 2 | 30 | — | 1.150 | 3.5/4.1 | 510/520 | — | — | non-uniform stretching, whitening. |
| 3 | — | — | — | — | — | — | — | loss of clarity. |
| 4 | 30 | 1.6018 | 1.375 | 40.5/11.5 | 900/420 | 0.3 | ○ | breakage, tear. |
| 5 | — | — | — | — | — | — | — | breakage. |
| 6 | — | — | — | — | — | — | — | breakage. |
| 7 | — | — | — | — | — | — | — | breakage. |
| 8 | 30 | — | — | — | — | — | — | breakage. |
| 9 | — | — | 1.050 | 2.5/1.5 | 310/350 | — | — | whitening. |
| 10 | — | — | — | — | — | — | — | loss of clarity, breakage. |
| 11 | 30 | 1.6002 | 1.390 | 40.5/39.8 | 800/830 | 0.5 | ○ | breakage, embrittle. |
| 12 | 30 | 1.6811 | 1.345 | 10.5/11.3 | 360/380 | 2.0 | x | — |

TABLE 2

| Example or Comparative Example | Ex. 13 | Ex. 14 | Ex. 15 | Ex. 16 | Ex. 17 | Compa. Ex. 13 | Compa. Ex. 14 | Compa. Ex. 15 |
|---|---|---|---|---|---|---|---|---|
| Humidification Condition | not humidify | | | in water 40° C. × 24 hrs. | | not humidify | | |
| Moisture Content (%) | 0.72 | | | 1.8 | | 0.72 | | |
| Preheating | | | | | | | | |
| Temperature (%) | 150 | 240 | 200 | 200 | 240 | 240 | 140 | 260 |
| Time (sec) | 300 | 30 | 120 | 60 | 30 | 120 | 300 | 20 |
| Moisture content (%) | 0.31 | 0.20 | 0.25 | 0.65 | 0.43 | 0.08 | 0.32 | 0.12 |
| Stretching | | uniaxial | | | biaxial | | uniaxial | |
| Temperature (°C.) | 150 | 240 | 200 | 200 | 240 | 200 | 140 | 260 |
| Rate (%/min) | 100 | 200 | 100 | 200 | 200 | 100 | 100 | 200 |
| Magnification | 1.5 | 2.0 | 2.0 | 2.5 | 2.0 × 2.0 | 1.5 | 1.5 | 1.5 |
| Film appearance after stretching | somewhat non-uniform | good | good | good | good | loss of clarify, non-uniform | breakage | loss of clarity, non-uniform |
| Tensile strength (kg/mm$^2$) | 18.5 | 24.8 | 25.5 | 30.5 | 24.1 | 2.1 | — | 1.1 |
| Refractive index (thickness direction) | 1.635 | 1.630 | 1.628 | 1.621 | 1.618 | — | — | — |
| Density (g/cm$^3$) | 1.352 | 1.361 | 1.359 | 1.370 | 1.369 | — | — | — |

What is claimed is:

1. A stretched polyimide film prepared by melt-extrusion and stretched in the absence of swelling with an organic solvent essentially consisting of a polyimide having recurring structural units of the formula (I):

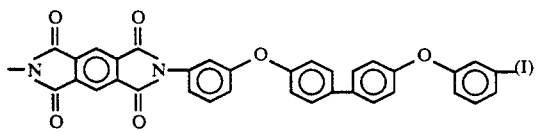

comprising a refractive index of from 1.605 to 1.680 at 23° C. in the direction of thickness.

2. A stretched polyimide film prepared by melt-extrusion and stretched in the absence of swelling with an organic solvent essentially consisting of a polyimide having recurring structural units of the formula (I):

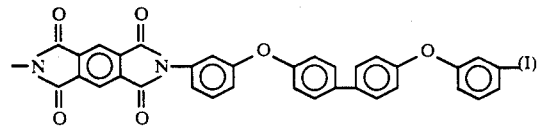

comprising a density of from 1.335 to 1.390 g/cm$^3$ at 23° C.

3. A stretched polyimide film prepared by melt-extrusion and stretched in the absence of swelling with an organic solvent essentially consisting of a polyimide having recurring structural units of the formula (I):

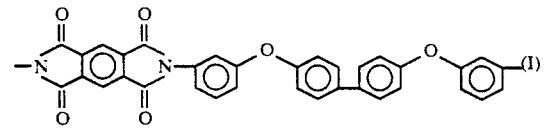

comprising a density of from 1.335 to 1.390 g/cm$^3$ at 23° C. and a refractive index of from 1.605 to 1.680 at 23° C. in the direction of thickness.

4. A process for preparing a polyimide film from a polyimide having recurring structural units of the formula (I):

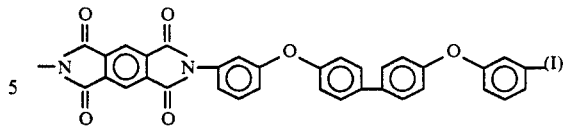

comprising the steps of melt-extruding an unstretched film, heat stretching the unstretched film in the temperature range of from 230° to 320° C. in the absence of swelling with an organic solvent and successively heat-setting the stretched film under tension.

5. The process of claim 4 wherein the unstretched film is stretched from 1.5 to 10 times in one direction or both directions which are at right angles to each other, and successively heat-setting the stretched film over tension in the temperature range of from 250° C. to less than the melting point of said film.

6. The process of claim 4 wherein the unstretched film is stretched from 1.5 to 5.0 times in one direction in the temperature range of from 230° to 300° C.

7. The process of claim 4 wherein the unstretched film is stretched from 1.5 to 3.0 times in one direction in the temperature range of from 240° to 300° C. and successively stretched from 1.5 to 3.0 times in the direction which is at right angles to said stretching direction in the temperature range of from 250° to 320° C.

8. The process of claim 4 wherein the unstretched film is stretched at the area magnification of from 2 to 10 simultaneously in both directions which are at right angles to each other in the temperature range of from 250° to 300° C.

9. The process of claim 4 wherein the unstretched film is stretched in the temperature range of from 150° C. to less than glass transition temperature of said film and simultaneously in the moisture content range of from 0.1 to 3% during the stretching step.

10. The process of claim 5 wherein the unstretched film is stretched from 1.5 to 5.0 times in one direction in the temperature range of from 230° to 300° C.

11. The process of claim 5 wherein the unstretched film is stretched from 1.5 to 3.0 times in one direction in the temperature range of from 240° to 300° C. and successively stretched from 1.5 to 3.0 times in the direction which is at right angles to said stretching direction in the temperature range of from 250° to 320° C.

12. The process of claim 5 wherein the unstretched film is stretched at the area magnification of from 2 to 10 simultaneously in both directions which are at right angles to each other in the temperature range of from 250° to 300° C.

* * * * *

UNITED STATES PATENT AND TRADEMARK OFFICE
CERTIFICATE OF CORRECTION

PATENT NO. : 5,260,407

DATED: : November 9, 1993

INVENTOR(S) : Masumi Saruwatari et al

It is certified that errors appear in the above-identified patent and that said Letters Patent is hereby corrected as shown below:

In column 3, line 67, please delete "n,,ny and n," and insert therefor
-- $n_x$, $n_y$ and $n_z$, --.

In column 5, line 9, please delete "1.350 kg/cm$^3$" and insert therefor
-- 1.350 g/cm$^3$ --.

Signed and Sealed this

Second Day of January, 1996

Attest:

BRUCE LEHMAN

*Attesting Officer*  *Commissioner of Patents and Trademarks*